United States Patent
Yusuf

(10) Patent No.: US 11,146,247 B2
(45) Date of Patent: Oct. 12, 2021

(54) STACKED CRYSTAL FILTER STRUCTURES

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/806,166

(22) Filed: Mar. 2, 2020

(65) Prior Publication Data

US 2021/0028755 A1 Jan. 28, 2021

Related U.S. Application Data

(60) Provisional application No. 62/878,362, filed on Jul. 25, 2019.

(51) Int. Cl.
| | |
|---|---|
| *H03H 9/58* | (2006.01) |
| *H03H 9/02* | (2006.01) |
| *H03H 9/56* | (2006.01) |
| *H03H 9/13* | (2006.01) |
| *H03H 9/17* | (2006.01) |

(52) U.S. Cl.
CPC ........ *H03H 9/585* (2013.01); *H03H 9/02086* (2013.01); *H03H 9/13* (2013.01); *H03H 9/17* (2013.01); *H03H 9/56* (2013.01)

(58) Field of Classification Search
CPC ...... H03H 9/02086; H03H 9/585; H03H 9/56; H03H 9/13; H03H 9/17; H03H 9/131; H03H 9/584
USPC .......................................... 333/133, 187, 188
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,442,434 A | 4/1984 | Baekgaard |
| 4,577,168 A | 3/1986 | Hartmann |
| 5,291,159 A | 3/1994 | Vale |
| 6,067,391 A | 5/2000 | Land |
| 6,670,866 B2 | 12/2003 | Ellaet et al. |

(Continued)

FOREIGN PATENT DOCUMENTS

JP 2012257050 A 12/2012

OTHER PUBLICATIONS

Non-Final Office Action for U.S. Appl. No. 16/283,044, dated Nov. 12, 2020, 9 pages.

(Continued)

*Primary Examiner* — Rakesh B Patel
*Assistant Examiner* — Jorge L Salazar, Jr.
(74) *Attorney, Agent, or Firm* — Withrow & Terranova, PLLC

(57) ABSTRACT

Acoustic resonators, such as bulk acoustic wave (BAW) resonators and, in particular, acoustic resonators including stacked crystal filters (SCFs) are disclosed. SCF structures are disclosed with increased spurious free ranges by providing various arrangements of acoustically soft materials in one or more locations that correspond with high stress regions of one or more modes. For SCFs operating in first order modes, relative amounts of acoustically soft materials within shared electrodes may be increased. One or more additional layers of acoustically soft materials may also be added to SCF structures near shared electrodes. Accordingly, SCFs may be provided with increased frequency spreads between first order modes and second order modes.

26 Claims, 6 Drawing Sheets

(56) References Cited

U.S. PATENT DOCUMENTS

| | | |
|---|---|---|
| 6,714,099 B2 | 3/2004 | Hikita et al. |
| 6,720,844 B1 | 4/2004 | Lakin |
| 6,927,649 B2 | 8/2005 | Metzger et al. |
| 6,927,651 B2 | 8/2005 | Larson, III et al. |
| 6,975,183 B2 | 12/2005 | Aigner et al. |
| 7,057,478 B2 | 6/2006 | Korden et al. |
| 7,173,504 B2 | 2/2007 | Larson, III et al. |
| 7,239,067 B2 | 7/2007 | Komuro et al. |
| 7,321,183 B2 | 1/2008 | Ebuchi et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,515,018 B2 | 4/2009 | Handtmann et al. |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Inoue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,929,716 B2 | 3/2018 | Lee et al. |
| 10,009,001 B2 | 6/2018 | Jiang et al. |
| 10,141,644 B2 | 11/2018 | Khlat et al. |
| 2002/0109564 A1 | 8/2002 | Tsai et al. |
| 2004/0100342 A1 | 5/2004 | Nishihara et al. |
| 2005/0057117 A1* | 3/2005 | Nakatsuka ............ H03H 9/589 310/311 |
| 2005/0093648 A1 | 5/2005 | Inoue |
| 2005/0206476 A1 | 9/2005 | Ella et al. |
| 2006/0091978 A1 | 5/2006 | Wang et al. |
| 2008/0007369 A1 | 1/2008 | Barber et al. |
| 2008/0169884 A1 | 7/2008 | Matsumoto et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0204995 A1 | 8/2011 | Jamneala et al. |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0113576 A1 | 5/2013 | Inoue et al. |
| 2013/0193808 A1 | 8/2013 | Feng et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2019/0140618 A1 | 5/2019 | Takamine |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |

OTHER PUBLICATIONS

Notice of Allowance for U.S. Appl. No. 15/697,658, dated Nov. 17, 2020, 7 pages.

Advisory Action for U.S. Appl. No. 15/883,933, dated Dec. 31, 2020, 3 pages.

Non-Final Office Action for U.S. Appl. No. 16/290,175, dated Jan. 6, 2021, 14 pages.

Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.

Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.

Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.

Final Office Action for U.S. Appl. No. 15/883,933, dated Oct. 23, 2020, 15 pages.

Notice of Allowance and Examiner-Initiated Interview Summary for U.S. Appl. No. 16/003,417, dated Aug. 5, 2020, 9 pages.

Final Office Action for U.S. Appl. No. 16/290,175, dated Sep. 17, 2020, 13 pages.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, dated Jun. 15, 2017, 7 pages.

Final Office Action for U.S. Appl. No. 15/275,957, dated Jan. 2, 2018, 7 pages.

Author Unknown, "SAW Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

(56) References Cited

OTHER PUBLICATIONS

Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Aigner, R. et al., "3G-4G-5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.
Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.
Volatier, A. et al., "Technology enhancements for high performance BAW duplexer," IEEE International Ultrasonics Symposium (IUS), Jul. 21-25, 2013, Prague, Czech Republic, IEEE, pp. 761-764.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
U.S. Appl. No. 15/720,706, filed Sep. 29, 2017.
U.S. Appl. No. 16/740,667, filed Jan. 13, 2020.
U.S. Appl. No. 16/776,738, filed Jan. 30, 2020.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.

* cited by examiner

STACKED CRYSTAL FILTER STRUCTURES

RELATED APPLICATIONS

This application claims the benefit of provisional patent application Ser. No. 62/878,362, filed Jul. 25, 2019, the disclosure of which is hereby incorporated herein by reference in its entirety.

FIELD OF THE DISCLOSURE

The present disclosure relates to acoustic resonators, such as bulk acoustic wave (BAW) resonators and, in particular, to acoustic resonators including stacked crystal filters (SCFs).

BACKGROUND

Wireless communication networks have continued to evolve in order to keep up with ever increasing data transmission demands of modern technology. With each new generation of cellular network technology, higher integration and smaller device sizes are needed to provide improved data capacity, connectivity, and coverage. As modern mobile communication systems are developed with increased complexity, high performance acoustic resonators are increasingly used as filters in such systems.

Acoustic filters, including bulk acoustic wave (BAW) resonators, are sometimes arranged in ladder network topologies that exhibit many desirable features, but can also provide limited operating bandwidths. Other acoustic filter configurations such as stacked crystal filters (SCFs) and coupled resonator filters (CRFs) can provide larger operating bandwidths. SCFs, as compared with CRFs, may typically have simpler configurations including fewer layers which can provide somewhat easier fabrication.

In such acoustic filters, degraded filter rejections can be caused by spurious resonances or spurious modes that are excited at certain frequencies. Spurious modes may be addressed by making use of the finite bandwidth of reflector structures in a solidly mounted resonator (SMR) configuration. Such reflector structures can include reflector layers that are designed to have suitable reflectivity within a desired filter bandwidth and are also designed to be lossy in filter stopbands, particularly at frequencies of spurious responses. Using this approach, many reflector layers are usually needed to obtain the desired reflector selectivity. Moreover, in filter configurations where multiple SCF structures with different frequencies are typically used, the spurious responses of the multiple SCFs tend not to overlap. As such, a single reflector structure may not be able to suppress spurious responses of all SCFs simultaneously. As advancements in mobile communication systems progress, the art continues to seek improved acoustic resonators and filter configurations capable of overcoming such challenges.

SUMMARY

The present disclosure relates in various aspects to acoustic resonators, such as bulk acoustic wave (BAW) resonators and, in particular, to acoustic resonators including stacked crystal filters (SCFs). SCF structures are disclosed with increased spurious free ranges by providing various arrangements of acoustically soft materials in one or more locations that correspond with high stress regions of one or more modes. For SCFs operating in first order modes, relative amounts of acoustically soft materials within shared electrodes may be increased. One or more additional layers of acoustically soft materials may also be added to SCF structures near shared electrodes. Accordingly, SCFs may be provided with increased frequency spreads between first order modes and second order modes.

In one aspect, an SCF comprises: a first piezoelectric layer; a second piezoelectric layer; a shared electrode between the first piezoelectric layer and the second piezoelectric layer; a first electrode on the first piezoelectric layer opposite the shared electrode; and a second electrode on the second piezoelectric layer opposite the shared electrode; wherein the shared electrode comprises a thickness as measured between the first piezoelectric layer and the second piezoelectric layer that is at least two and a half times greater than at least one of a thickness of the first electrode or a thickness of the second electrode. In certain embodiments, the thickness of the shared electrode is at least three times greater than at least one of the thickness of the first electrode or the thickness of the second electrode. In certain embodiments, the thickness of the shared electrode is at least four times greater than at least one of the thickness of the first electrode or the thickness of the second electrode. In certain embodiments, the thickness of the shared electrode is in a range including two and a half times greater and four times greater than at least one of the thickness of the first electrode or the thickness of the second electrode. In certain embodiments, the thickness of the shared electrode is at least two and a half times greater than the thickness of the first electrode and at least two and a half times greater than the thickness of the second electrode.

In certain embodiments, a frequency of a second order mode is at least 2.5 times higher than a frequency of a first order mode. In certain embodiments, the frequency of the second order mode is in a range including 2.5 higher and 4 times higher than the frequency of the first order mode. In certain embodiments, the shared electrode comprises a plurality of sublayers. In certain embodiments, the plurality of sublayers comprises a first sublayer, a second sublayer, and a third sublayer, wherein the second sublayer is arranged between the first sublayer and the third sublayer, and the second sublayer is at least two and a half times greater than at least one of the thickness of the first electrode or the thickness of the second electrode.

In certain embodiments, the shared electrode comprises an acoustically soft material having a stiffness parameter that is lower than a stiffness parameter of the first piezoelectric layer and the second piezoelectric layer. In certain embodiments, the acoustically soft material comprises a thickness that is at least two and a half times greater than at least one of the thickness of the first electrode or the thickness of the second electrode. In certain embodiments, the stiffness parameter is less than or equal to 150 gigapascals (GPa), or in a range including 50 GPa and 150 GPa. In certain embodiments, the acoustically soft material comprises a dielectric layer or a metal layer.

In another aspect, an SCF comprises: a first piezoelectric layer; a second piezoelectric layer; a shared electrode between the first piezoelectric layer and the second piezoelectric layer; a first electrode on the first piezoelectric layer opposite the shared electrode; a second electrode on the second piezoelectric layer opposite the shared electrode; and a first layer between the shared electrode and the second piezoelectric layer, the first layer comprising a material with a stiffness parameter that is lower than a stiffness parameter of the second piezoelectric layer. In certain embodiments, the first layer comprises a stiffness parameter of less than or equal to 150 gigapascals (GPa). In certain embodiments, the first layer comprises a stiffness parameter in a range including 50 GPa and 150 GPa. In certain embodiments, the first layer comprises a dielectric layer. In certain embodiments, the dielectric layer comprises silicon dioxide. In certain embodiments, the first layer comprises a metal layer. In certain embodiments, the metal layer comprises an aluminum copper alloy.

In certain embodiments, the SCF further comprises a second layer between the shared electrode and the first piezoelectric layer, the second layer comprising a material with a stiffness parameter that is lower than a stiffness parameter of the first piezoelectric layer. In certain embodiments, the first layer and the second layer comprise a same material. In certain embodiments, the first layer and the second layer comprise different materials. In certain embodiments, a frequency of a second order mode is at least 2.5 times higher than a frequency of a first order mode. In certain embodiments, the frequency of the second order mode is in a range including 2.5 higher and 4 times higher than the frequency of the first order mode.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5 illustrates a comparison of the transmission response of the

Figure 1A:
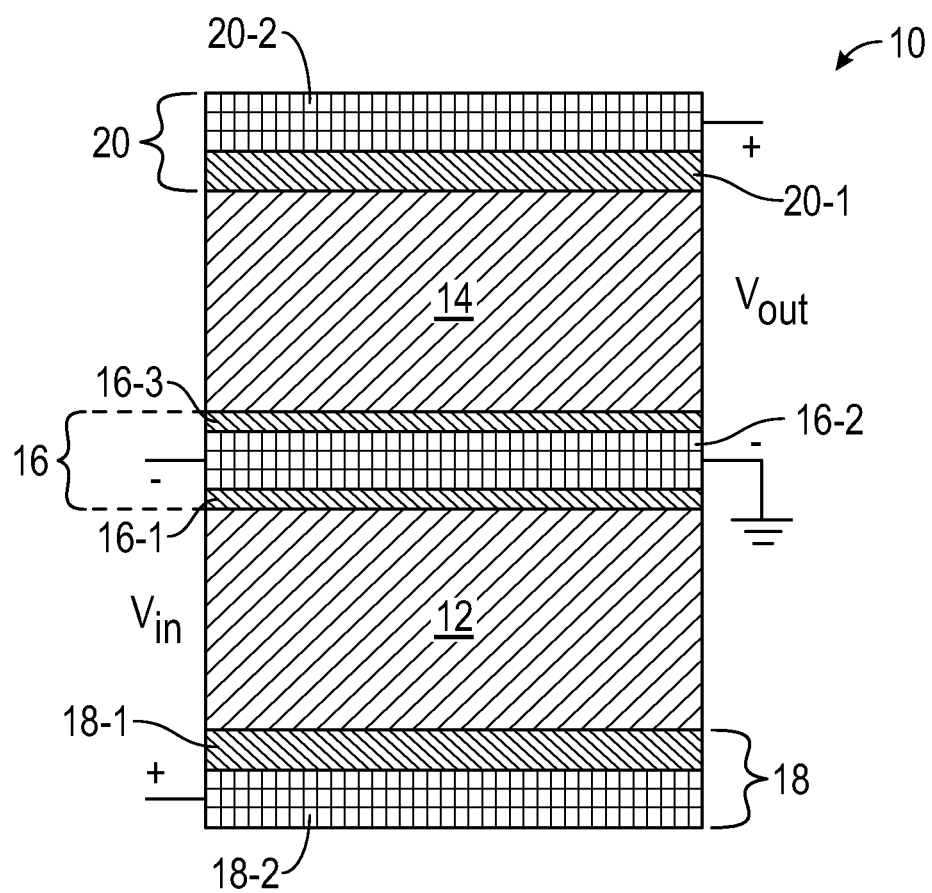
FIG. 1A is a diagram illustrating a typical stacked crystal filter (SCF).
Figure 4:
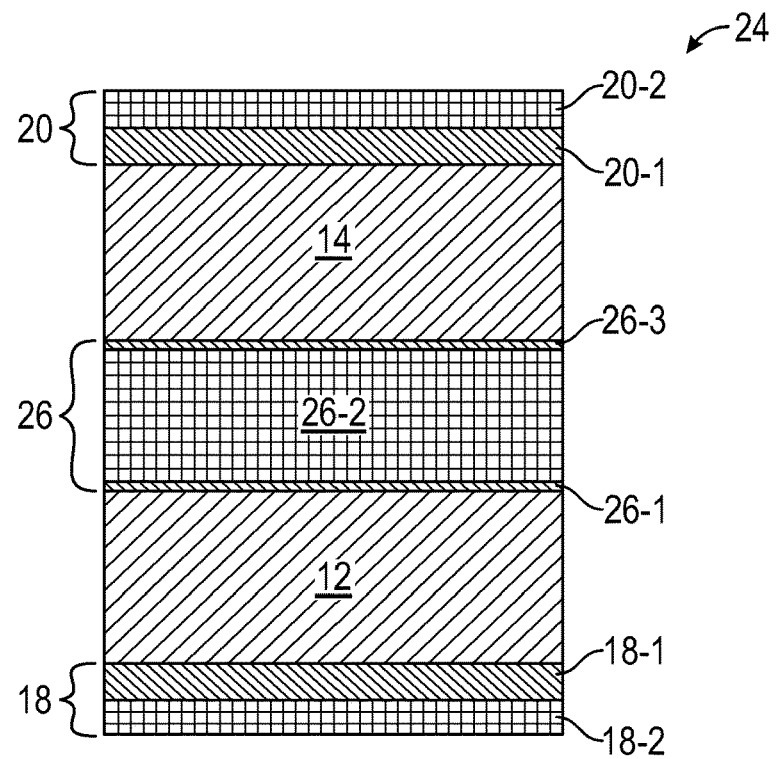
FIG. 4 is a diagram illustrating an SCF with an increased spurious free range provided by increasing an amount of acoustically soft material that is registered with a shared electrode or ground plane of the SCF.

SCF of FIG. 1A and the SCF of FIG. 4.

Figure 6:
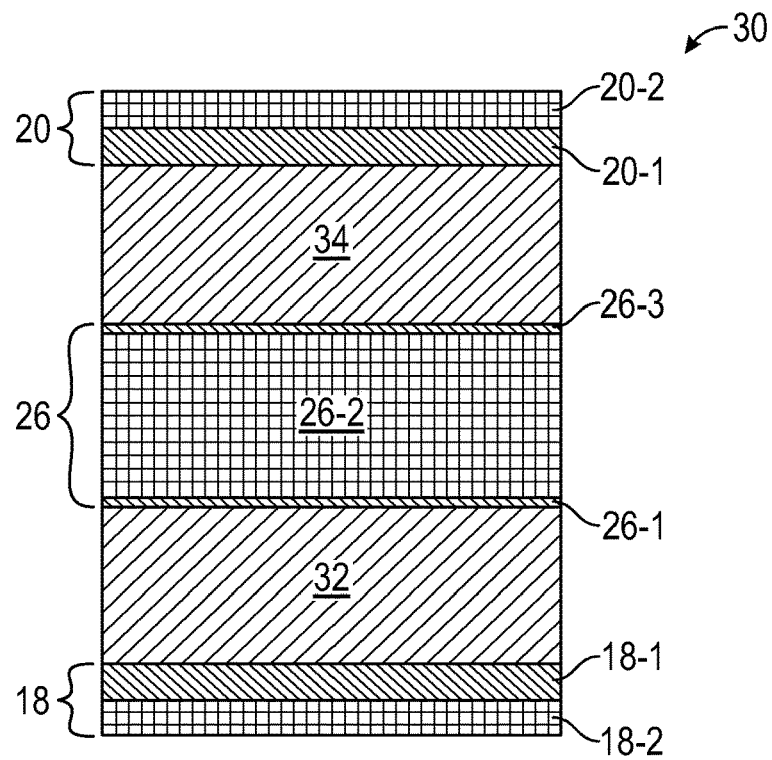

FIG. 6 illustrates an SCF that includes reduced piezoelectric layer thicknesses compared to the SCF of FIG. 4 to provide equal frequencies of operation of the $1^{st}$ order mode and increased spurious free range.

Figure 7:
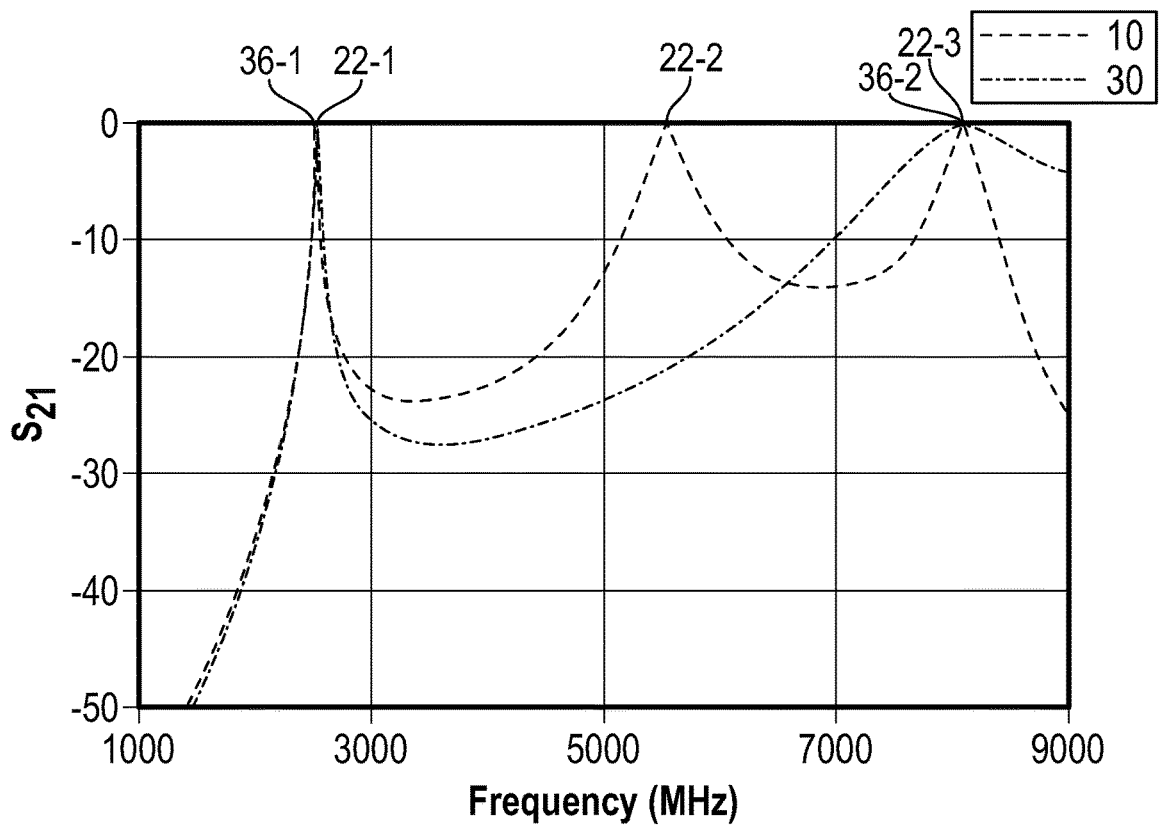

FIG. 7 illustrates a comparison of the transmission response of the SCF of FIG. 1A and the SCF 30 of FIG. 6.

Figure 8:
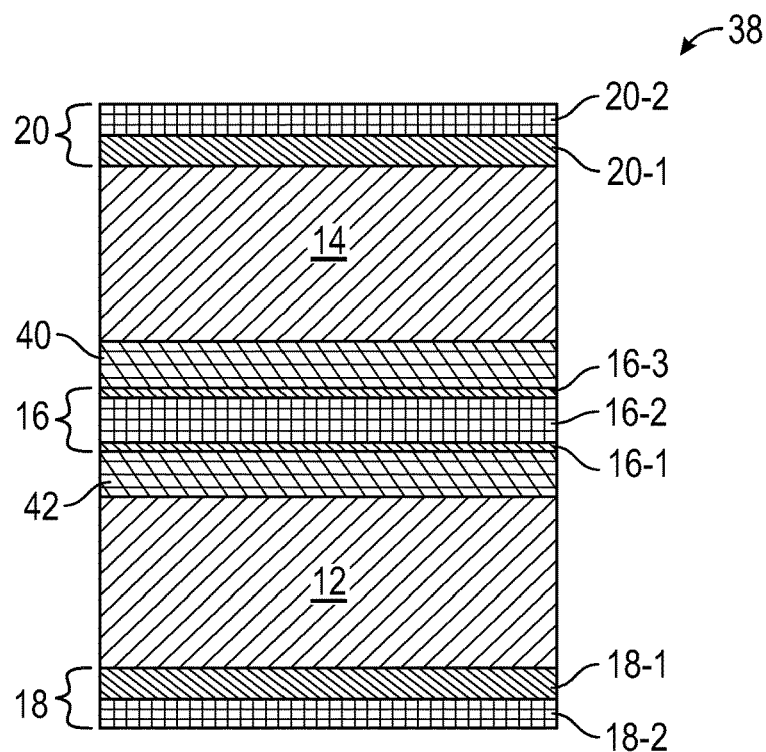

FIG. 8 illustrates an SCF that includes first and second layers of acoustically soft material that are arranged respectively between a shared electrode and first and second piezoelectric layers to provide increases in the spurious free range.

Figure 9:
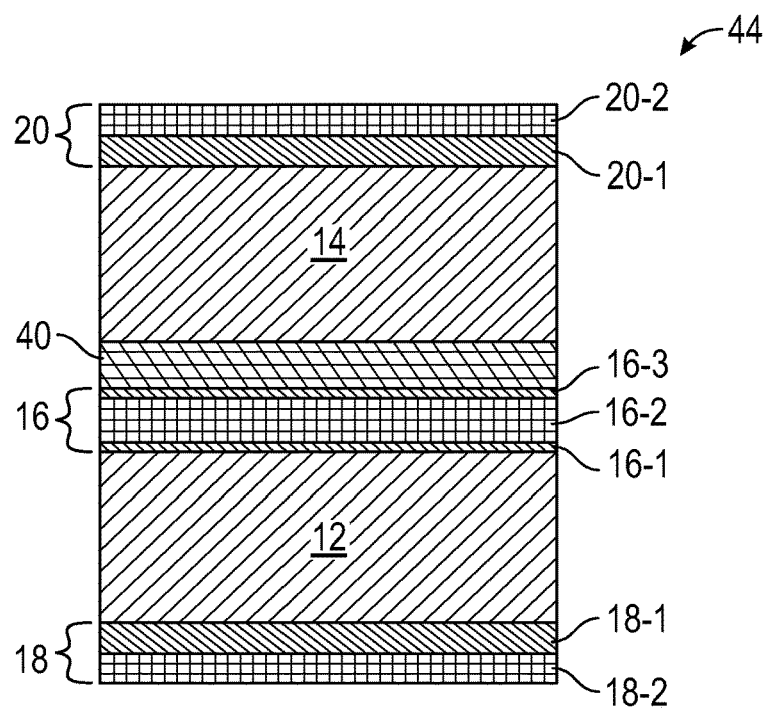

FIG. 9 illustrates an SCF that is similar to the SCF of FIG. 8, but only includes a first layer of acoustically soft material to provide an increase in the spurious free range.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in various aspects to acoustic resonators, such as bulk acoustic wave (BAW) resonators and, in particular, to acoustic resonators including stacked crystal filters (SCFs). SCF structures are disclosed with increased spurious free ranges by providing various arrangements of acoustically soft materials in one or more locations that correspond with high stress regions of one or more modes. For SCFs operating in first order modes, relative amounts of acoustically soft materials within shared electrodes may be increased. One or more additional layers of acoustically soft materials may also be added to SCF structures near shared electrodes. Accordingly, SCFs may be provided with increased frequency spreads between first order modes and second order modes.

BAW resonators in SCFs are used in many high-frequency filter applications. FIG. 1A is a diagram illustrating a typical SCF 10. The SCF 10 includes first and second piezoelectric layers 12, 14 with a shared electrode 16 serving as a common ground plane that acoustically couples the first and second piezoelectric layers 12, 14. A first electrode 18 is arranged on the first piezoelectric layer 12, and a second electrode 20 is arranged on the second piezoelectric layer 14. In FIG. 1A, a voltage applied across input terminals arranged at the first electrode 18 and the shared electrode 16 induces an acoustic wave which couples into the second piezoelectric layer 14 through the shared electrode 16 forming a standing wave in the full structure. It should be understood that the input terminals may alternatively be arranged at the second electrode 20 and the shared electrode 16. Each of the first electrode 18, the second electrode 20, and the shared electrode 16 may comprise one or more sublayers (e.g., 18-1 to 18-2, 20-1 to 20-2, and 16-1 to 16-3) having different electrical, mechanical, and/or acoustic properties. In operation, the SCF 10 exhibits multiple modes corresponding to the different eigenfunctions the SCF 10 supports.

Figure 1B:
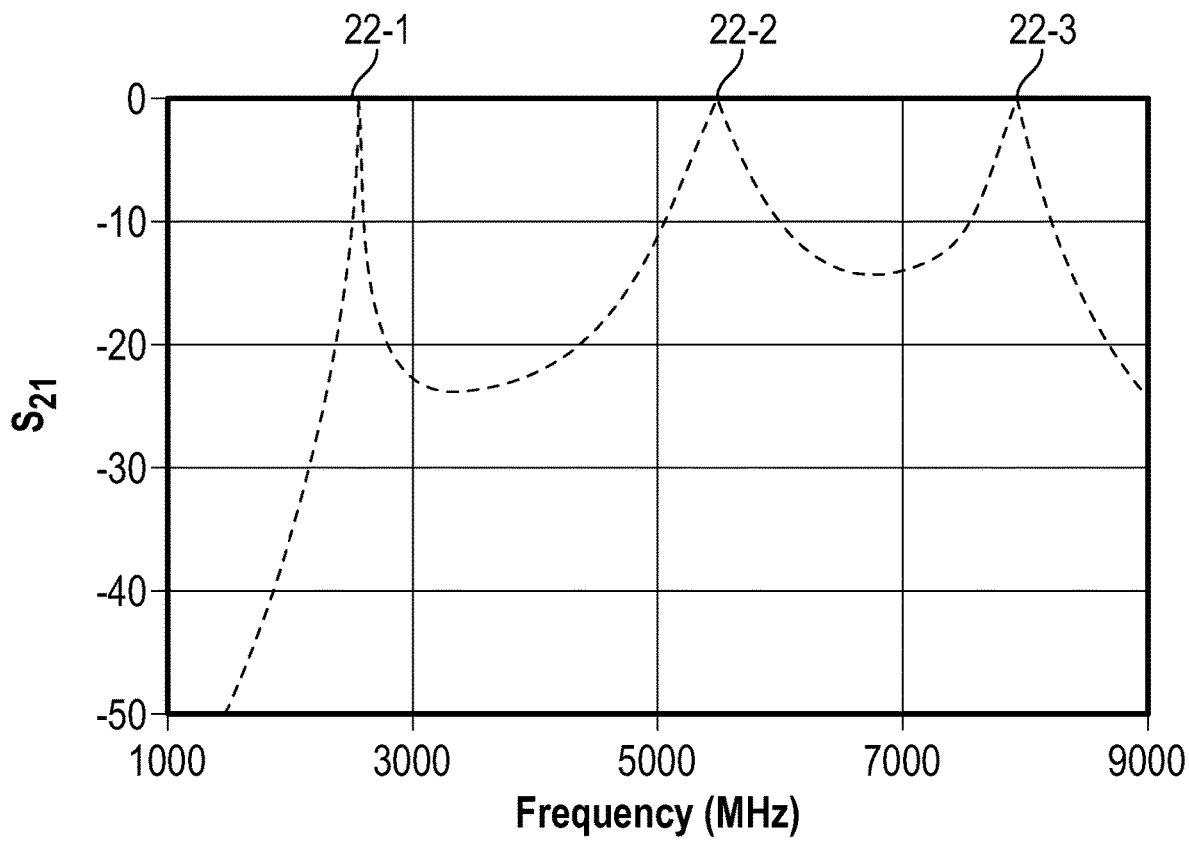
FIG. 1B illustrates a transmission response of the SCF of FIG. 1A exhibiting multiple modes formed along a frequency range.

FIG. 1B illustrates a typical transmission response of the SCF 10 of FIG. 1A exhibiting multiple modes 22-1 to 22-3 formed along a frequency range. The three main peaks in the transmission response correspond to the modes 22-1 to 22-3 that are excited at progressively increasing frequencies. In this regard, the modes 22-1 to 22-3 may be referred to as order modes where a first mode 22-1 is a first order mode, a second mode 22-2 is a second order mode, a third mode 22-3 is a third order mode, and so on. In the example of FIG. 1B, the first mode 22-1 is configured at a frequency of 2500 megahertz (MHz), the second mode 22-2 is configured at a frequency of 5480 MHz, and the third mode 22-3 is configured at a frequency of 7970 MHz.

Figure 2:
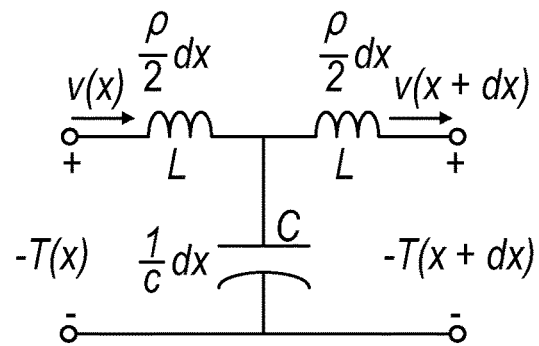
FIG. 2 illustrates a representative circuit showing analogous characteristics of an acoustic transmission line and an electrical transmission line.

In order to understand principles of operation according to embodiments disclosed herein, a brief description of relevant theory is provided. The propagation of acoustic waves in solids can be analyzed using equivalent or analogous transmission lines. The basis behind this approach is the close analogy between the equations of an acoustic transmission line in one dimension and the equations of an electrical transmission line. For example, analogous equations may be expressed according to acoustic transmission Equation (1) for Newton's law and electrical transmission Equation (2) for Kirchoff's voltage law as well as acoustic transmission Equation (3) for Hooke's law and electrical transmission Equation (4) for Kirchoff's current law:

$$\frac{d}{dx}(-T) = -j\omega\rho v, \qquad (1)$$

$$\frac{dV}{dx} = -j\omega LI \qquad (2)$$

$$\frac{dv}{dx} = -j\frac{\omega}{c}(-T), \qquad (3)$$

$$\frac{dI}{dx} = -j\omega CV \qquad (4)$$

where acoustic stress $-T$ is analogous with electrical voltage $V$, acoustic velocity $v$ is analogous with electrical current $I$, acoustic inverse stiffness $c^{-1}$ is analogous with electrical capacitance and acoustic density $\rho$ is analogous with electrical inductance. In this regard, FIG. 2 illustrates a representative circuit showing the analogous characteristics of an acoustic transmission line and an electrical transmission line. Given this analogy, useful modeling can be applied from microwave applications for use with acoustic applications. As such, a result of particular interest is the perturbation of microwave cavity resonators due to a change of material parameters. The resonance frequency of such a cavity is lowered when the electrical permittivity is increased at a point of high electric field. This approach of capacitive loading can be used in microwave and antenna applications to provide miniaturized resonators and antennas. In the domain of acoustics, this may translate as a decrease in material stiffness at points of high stress within a resonant acoustic structure may result in a decrease in the resonance frequency. Incidentally, such a change in stiffness may not affect the resonance frequency if performed at a point where the stress is zero or near zero.

Figure 3:
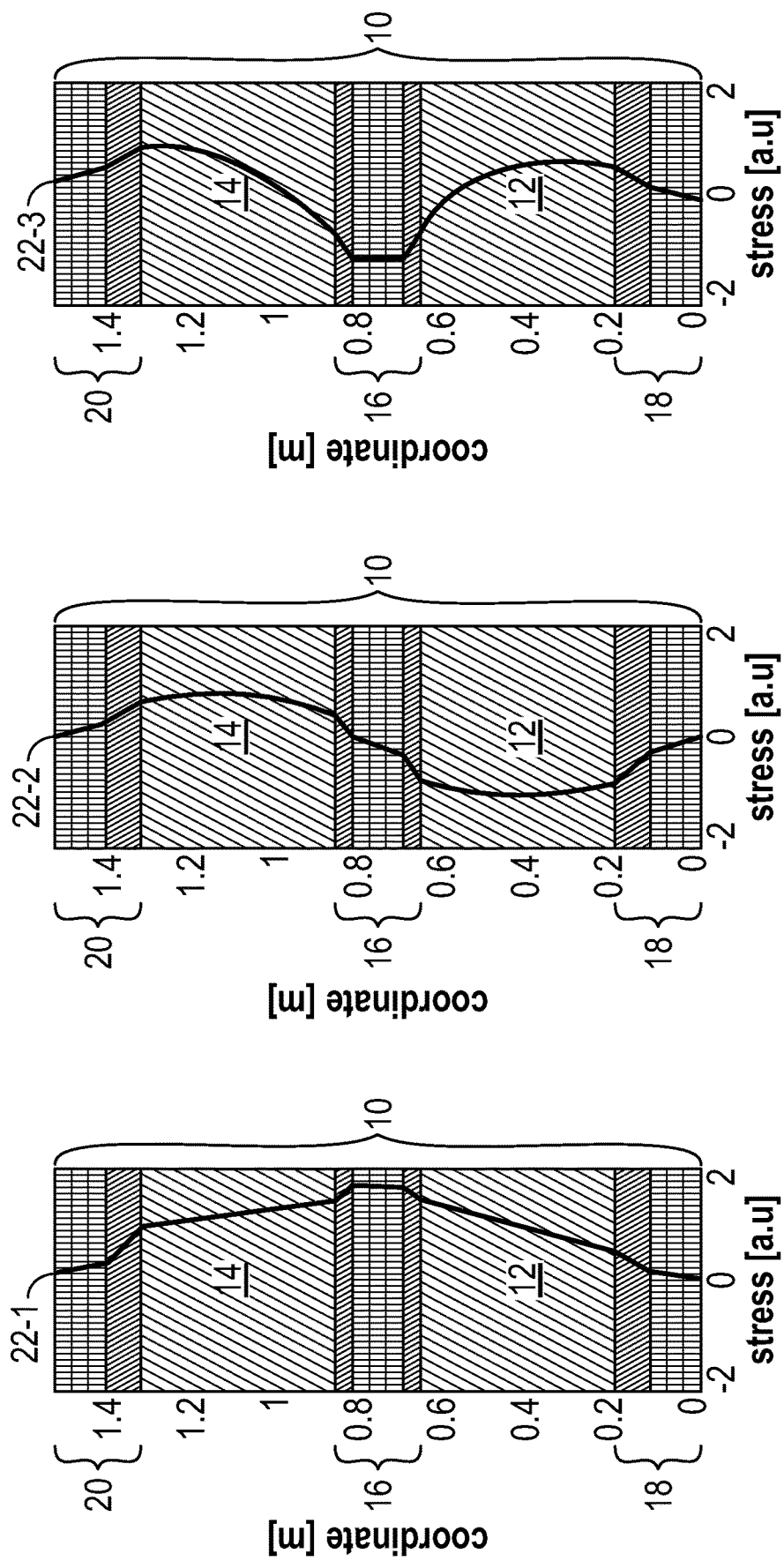
FIGS. 3A-3C illustrate stress profiles for three order modes of FIG. 1B.

FIGS. 3A-3C respectively illustrate stress profiles for each of the three modes 22-1 to 22-3 of FIG. 1B for the SCF 10 of FIG. 1A. In FIG. 3A, the stress profile of the first mode 22-1 exhibits approximately a half wavelength through the SCF 10 with a highest magnitude of stress registered with the shared electrode 16. In FIG. 3B, the stress profile of the second mode 22-2 exhibits approximately a full wavelength through the SCF 10 with low stress in regions registered with the shared electrode 16. In FIG. 3C, the stress profile of the third mode 22-3 exhibits approximately one and a half wavelengths through the SCF 10 with a highest magnitude of stress registered with the shared electrode 16.

In certain embodiments, an SCF may be configured with an increased or large spurious free range by placing an acoustically soft material at or near high stress regions within the stress profile of a desired operating mode. For example, an SCF operating in a first order mode may have its spurious free range increased by placing an acoustically soft material at a high stress point relative to the first order mode. As illustrated above in FIGS. 3A and 3B, the highest magnitude of stress for the first mode 22-1 is registered with the shared electrode 16 while the second mode 22-2 exhibits low stress in the same regions. As such, the first mode 22-1 may be shifted to a lower frequency and a frequency spread with the second mode 22-2 may be increased to provide an increased spurious free range.

FIG. 4 is a diagram illustrating an SCF 24 with an increased spurious free range provided by increasing the amount of acoustically soft material that is registered with a shared electrode 26 or ground plane of the SCF 24. As illustrated, the SCF 24 includes the first electrode 18, the second electrode 20, the first piezoelectric layer 12 and the second piezoelectric layer 14 as previously described for FIG. 1A. The shared electrode 26 is illustrated with a first sublayer 26-1, a second sublayer 26-2, and a third sublayer 26-3. The first sublayer 26-1 is arranged between the second sublayer 26-2 and the first piezoelectric layer 12, and the third sublayer 26-3 is arranged between the second piezoelectric layer 14 and the second sublayer 26-2. As such, the second sublayer 26-2 is arranged between the first sublayer 26-1 and the third sublayer 26-3. The first sublayer 26-1 and the third sublayer 26-3 may comprise a metal with a stiffness parameter that is greater than a stiffness parameter of a metal of the second sublayer 26-2. In this regard, the first sublayer 26-1 and the third sublayer 26-3 may provide additional degrees of freedom to design the coupling to the SCF and its quality factor. The second sublayer 26-2 may provide a lower overall electrical resistance for the shared electrode 26. In certain embodiments, a first sublayer 18-1 of the first electrode 18 and a first sublayer 20-1 of the second electrode 20 may both comprise a same material as the first and third sublayers 26-1, 26-3 of the shared electrode 26. Additionally, a second sublayer 18-2 of the first electrode 18 and a second sublayer 20-2 of the second electrode 20 may each comprise a same material as the second sublayer 26-2 of the shared electrode 26.

In certain embodiments, the first sublayer 26-1 and the third sublayer 26-3 may comprise a metal such as tungsten (W) or alloys thereof while the second sublayer 26-2 may comprise a metal such as an aluminum copper (AlCu) alloy. The stiffness parameter of W is typically 525 gigapascals (GPa) while the stiffness parameter of a representative AlCu alloy is 110 GPa. For comparison, the first piezoelectric layer 12 and the second piezoelectric layer 14 may comprise aluminum nitride (AlN) having a stiffness parameter of 415 GPa. In this regard, such AlCu alloys may be referred to as acoustically soft materials having a stiffness parameter that is less than the first and second piezoelectric layers 12, 14. While AlCu alloys are discussed above, acoustically soft materials relative to the piezoelectric layers 12, 14 and other metal sublayers (e.g., 26-1, 26-3) may comprise any material with a stiffness parameter less than or equal to 150 GPa, or in a range including 50 GPa and 150 GPa, or in a range including 75 GPa and 150 GPa.

In order to increase the spurious free range of the SCF 24, a thickness of the second sublayer 26-2 having the acoustically soft material is increased. As such, a thickness of the shared electrode 26 as measured in a perpendicular direction between the first piezoelectric layer 12 and the second piezoelectric layer 14 is increased. In certain embodiments, the thickness of the shared electrode 26 is configured to be at least two and half times greater that at least one of a thickness of the first electrode 18 or a thickness of the second electrode 20 where the thicknesses of the first electrode 18 and the second electrode 20 are measured in a same direction as the thickness of the shared electrode 16. In further embodiments, the thickness of the shared electrode 26 is configured to be at least three times greater, or at least four times greater, or in a range including two and half times greater and four times greater than at least one of the thickness of the first electrode 18 or the thickness of the second electrode 20. In certain embodiments, the thickness of the shared electrode 26 is at least two and a half times greater, or at least three times greater, or at least four times greater, or in a range including two and half times greater and four times greater than each of the thickness of the first electrode 18 and the thickness of the second electrode 20. In certain embodiments, the thickness of the second sublayer 26-2 is at least two and a half times greater, or at least four times greater, or in a range including two and half times greater and four times greater than at least one of the thickness of the first electrode 18 or the thickness of the second electrode 20.

Figure 5:
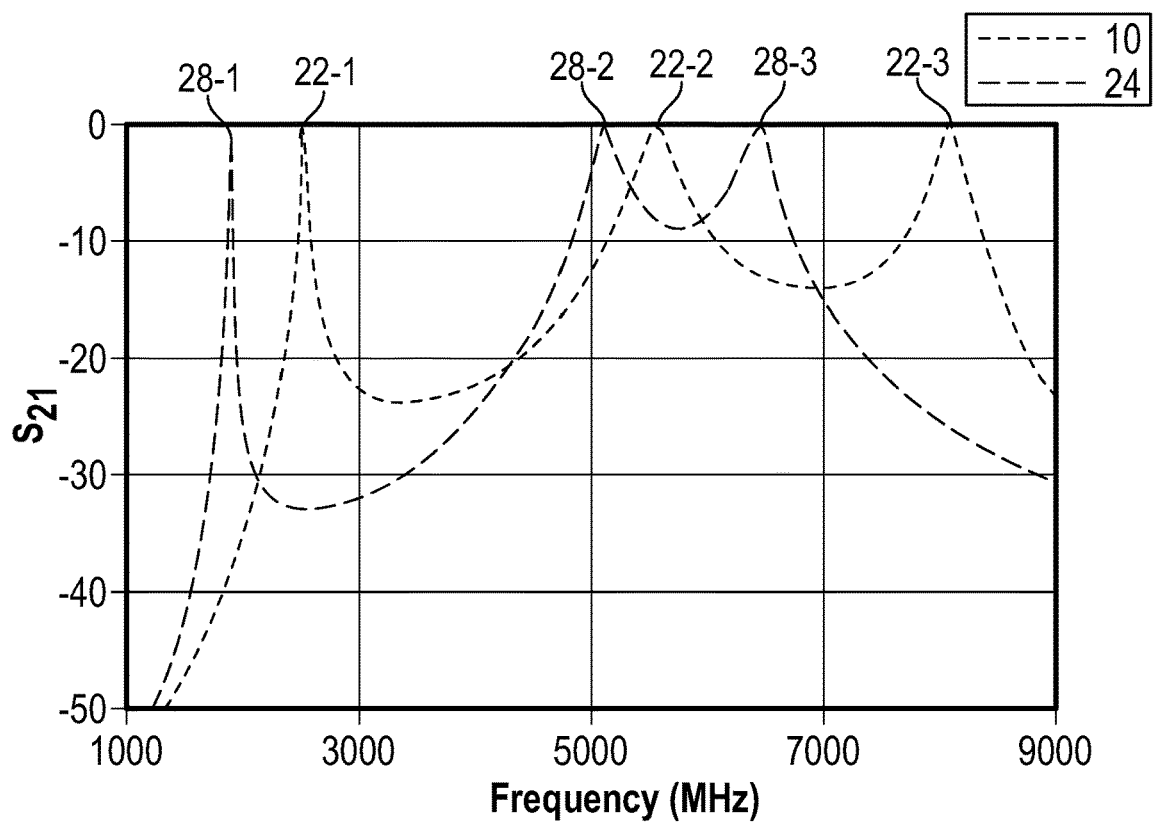

FIG. 5 illustrates a comparison of the transmission response of the multiple modes 22-1 to 22-3 of the SCF 10 of FIG. 1A and multiple modes 28-1 to 28-3 of the SCF 24 of FIG. 4. As illustrated, a first mode 28-1 of the SCF 24 is shifted to a lower frequency than the first mode 22-1 of the SCF 10. Additionally, a third mode 28-3 of the SCF 24 is also shifted notably lower than the third mode 22-3 of the SCF 10 since the stress profile of the third mode (e.g., 22-3 of FIG. 3C) is also higher along the shared electrode (e.g., 16 of FIG. 3C). A second mode 28-2 of the SCF 24 also shifts lower, but with a comparatively smaller decrease than the first mode 28-1 and the third mode 28-3. As such, a frequency spread between the first mode 28-1 and the second mode 28-2 may be increased. While the SCF 24 described in FIG. 4 and FIG. 5 demonstrates increased spurious free range, the spurious free range may be further increased and/or tuned by adjusting one or more other layers of the SCF 24.

FIG. 6 illustrates an SCF 30 that includes reduced piezoelectric layer thicknesses compared to the SCF 24 of FIG. 4 to bring the SCF resonant frequency back to the desired value of 2.5 GHz. The SCF 30 is similar to the SCF 24 of FIG. 4 in that the shared electrode 26 is provided with an increased thickness of acoustically soft material. In FIG. 6, the SCF 30 includes a first piezoelectric layer 32 and a second piezoelectric layer 34 that have reduced thicknesses compared with the first piezoelectric layer 12 and the second piezoelectric layer 14 of the SCF 24 of FIG. 4. By providing the first piezoelectric layer 32 and the second piezoelectric layer 34 with reduced thicknesses in combination with the increased thickness of the shared electrode 26, the spurious free range of the SCF 30 may be tuned with further increases compared with the SCF 10 of FIG. 1A.

FIG. 7 illustrates a comparison of the transmission response of the multiple modes 22-1 to 22-3 of the SCF 10 of FIG. 1A and multiple modes 36-1 to 36-2 of the SCF 30 of FIG. 6. As illustrated, by reducing piezoelectric layer thicknesses as described for the SCF 30 of FIG. 6, a first mode 36-1 of the SCF 30 may be tuned to be close to or the same as the first mode 22-1 of the SCF 10 of FIG. 1A. Such tuning may be beneficial to provide the SCF 30 with operation in the first mode 36-1 with a similar frequency to the SCF 10. In other embodiments, the frequency of the first mode 36-1 of the SCF 30 may be tuned to a frequency that is different than the first mode 22-1 of the SCF 10 for other applications. As further illustrated, a second mode 36-2 of the SCF 30 is increased to a frequency that is close to or the same as the third mode 22-3 of the SCF 10. For operation in the first mode 36-1, the spread between the first mode 36-1 and the second mode 36-2 may define the spurious free range for the SCF 30. In this regard, a frequency of the first mode 36-1 is provided at least 5 gigahertz (GHz) away from a frequency of the second mode 36-2. In certain embodiments, the principles described herein may be applied to provide the SCF 30 with the frequency of the first mode 36-1 that is in a range including 5 GHz and 8 GHz away from a frequency of the second mode 36-2. While 5 GHz and 8 GHz frequency spread examples are provided above, the principles described are applicable to any frequency range of operation. In particular, relative spreads between the first mode 36-1 and the second mode 36-2 may scale depending on the frequency range of operation. In certain embodiments, a frequency of the second mode 36-2 may be configured to be at least 2.5 times higher, or in a range including 2.5 times higher and 4 times higher than a frequency of the first mode 36-1.

While the previously described embodiments provide examples for increasing spurious free ranges of SCFs by increasing amounts of acoustically soft materials within shared electrodes, the principles described herein may be applicable to other SCF arrangements. For example, additional layers may be added to SCF structures that are separate from shared electrodes, such as one or more additional layers of acoustically soft materials that are added between the shared electrode and one or more piezoelectric layers. As such, the additional layers may comprise acoustically soft metals, dielectric materials, and combinations thereof. In certain embodiments, SCF structures may include combinations of shared electrodes with increased amounts of acoustically soft materials and one or more additional layers of acoustically soft materials.

FIG. 8 illustrates an SCF 38 that includes first and second layers 40, 42 of acoustically soft material that are arranged respectively between the shared electrode 16 and the first and second piezoelectric layers 12, 14 to provide increases in the spurious free range. The SCF 38 includes the first electrode 18, the shared electrode 16, the second electrode 20, the first piezoelectric layer 12 and the second piezoelectric layer 14 in a similar manner to the SCF 10 of FIG. 1A. As illustrated, the SCF 38 includes the first layer 40 arranged between the shared electrode 16 and the second piezoelectric layer 14, and the second layer 42 arranged between the shared electrode 16 and the first piezoelectric layer 12. The first layer 40 and the second layer 42 may comprise an acoustically soft material such as any material having a stiffness parameter less than or equal to 150 GPa. In this regard, additional acoustically soft materials are provided near the shared electrode 16 where the stress profile of the first mode (22-1 of FIG. 3A) is highest. In such locations, the acoustically soft materials can include metals or other materials having high quality factors to reduce losses. In certain embodiments, the first layer 40 and the second layer 42 may comprise one or more of a metal layer, a dielectric layer and combinations thereof. For example, the first layer 40 and the second layer 42 may comprise one or more of an AlCu alloy and a dielectric material such as silicon dioxide ($SiO_2$). The first layer 40 and the second layer 42 may comprise the same material or different acoustically soft materials. In certain embodiments, the dielectric material may comprise $SiO_2$ that is configured with a stiffness parameter of 75 GPa. While the first layer 40 and the second layer 42 are illustrated as single layers within the SCF 38, each may include one or more sublayers of the same or different acoustically soft materials. By providing the first and second layers 40, 42 with such arrangements, the SCF 38 may be configured with an increased spurious free range.

FIG. 9 illustrates an SCF 44 that is similar to the SCF 38 of FIG. 8, but only includes the first layer 40 of acoustically soft material to provide an increase in the spurious free range. In certain embodiments, an increased spurious free range may be provided by including one or more additional layers on a single side of the SCF 44. In FIG. 9, the first layer 40 is provided between the shared electrode and the second piezoelectric layer 14. In other embodiments, the first layer 40 may be configured between the shared electrode 16 and the first piezoelectric layer 12, depending on the application.

As disclosed herein SCF structures are provided that include increased spurious free ranges by arranging or increasing amounts of acoustically soft materials in one or more locations that correspond with high stress regions of one or more order modes. In addition to increased spurious free ranges, such structures may provide various benefits including relatively easy implementations and compatibility with thin-film BAW resonator (FBAR) and SMR structures.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A stacked crystal filter (SCF) comprising:
    a first piezoelectric layer;
    a second piezoelectric layer;
    a shared electrode between the first piezoelectric layer and the second piezoelectric layer;
    a first electrode on the first piezoelectric layer opposite the shared electrode; and
    a second electrode on the second piezoelectric layer opposite the shared electrode;
    wherein the shared electrode comprises a thickness as measured between the first piezoelectric layer and the second piezoelectric layer that is at least two and a half times greater than at least one of a thickness of the first electrode or a thickness of the second electrode.

2. The SCF of claim 1, wherein the thickness of the shared electrode is at least three times greater than at least one of the thickness of the first electrode or the thickness of the second electrode.

3. The SCF of claim 1, wherein the thickness of the shared electrode is at least four times greater than at least one of the thickness of the first electrode or the thickness of the second electrode.

4. The SCF of claim 1, wherein the thickness of the shared electrode is in a range between two and a half times greater and four times greater than at least one of the thickness of the first electrode or the thickness of the second electrode.

5. The SCF of claim 1, wherein the thickness of the shared electrode is at least two and a half times greater than the thickness of the first electrode and at least two and a half times greater than the thickness of the second electrode.

6. The SCF of claim 1, wherein a frequency of a second order mode is at least 2.5 times higher than a frequency of a first order mode.

7. The SCF of claim 6, wherein the frequency of the second order mode is in a range between 2.5 times higher and 4 times higher than the frequency of the first order mode.

8. The SCF of claim 1, wherein the shared electrode comprises a plurality of sublayers.

9. The SCF of claim 8, wherein:
    the plurality of sublayers comprises a first sublayer, a second sublayer, and a third sublayer;
    the second sublayer is arranged between the first sublayer and the third sublayer; and
    the second sublayer comprises a thickness that is at least two and a half times greater than at least one of the thickness of the first electrode or the thickness of the second electrode.

10. The SCF of claim 1, wherein the shared electrode comprises an acoustically soft material having a stiffness parameter that is lower than a stiffness parameter of the first piezoelectric layer and the second piezoelectric layer.

11. The SCF of claim 10, wherein the acoustically soft material comprises a thickness that is at least two and a half times greater than at least one of the thickness of the first electrode or the thickness of the second electrode.

12. The SCF of claim 10, wherein the stiffness parameter of the shared electrode is less than or equal to 150 gigapascals (GPa).

13. The SCF of claim 10, wherein the stiffness parameter of the shared electrode is in a range including 50 gigapascals (GPa) and 150 GPa.

14. The SCF of claim 10, wherein the acoustically soft material comprises a dielectric layer.

15. The SCF of claim 10, wherein the acoustically soft material comprises a metal layer.

16. A stacked crystal filter (SCF) comprising:
a first piezoelectric layer;
a second piezoelectric layer;
a shared electrode between the first piezoelectric layer and the second piezoelectric layer;
a first electrode on the first piezoelectric layer opposite the shared electrode;
a second electrode on the second piezoelectric layer opposite the shared electrode; and
a first layer between the shared electrode and the second piezoelectric layer, the first layer comprising a material with a stiffness parameter that is lower than a stiffness parameter of the second piezoelectric layer;
wherein a frequency of a second order mode is at least 2.5 times higher than a frequency of a first order mode.

17. The SCF of claim 16, wherein the first layer comprises a stiffness parameter of less than or equal to 150 gigapascals (GPa).

18. The SCF of claim 16, wherein the first layer comprises a stiffness parameter in a range between 50 gigapascals (GPa) and 150 GPa.

19. The SCF of claim 16, wherein the first layer comprises a dielectric layer.

20. The SCF of claim 19, wherein the dielectric layer comprises silicon dioxide.

21. The SCF of claim 16, wherein the first layer comprises a metal layer.

22. The SCF of claim 21, wherein the metal layer comprises an aluminum copper alloy.

23. The SCF of claim 16, further comprising a second layer between the shared electrode and the first piezoelectric layer, the second layer comprising a material with a stiffness parameter that is lower than a stiffness parameter of the first piezoelectric layer.

24. The SCF of claim 23, wherein the first layer and the second layer comprise a same material.

25. The SCF of claim 23, wherein the first layer and the second layer comprise different materials.

26. The SCF of claim 16, wherein the frequency of the second order mode is in a range between 2.5 times higher and 4 times higher than the frequency of the first order mode.

* * * * *